(12) United States Patent
Chang et al.

(10) Patent No.: US 8,982,659 B2
(45) Date of Patent: Mar. 17, 2015

(54) BITLINE FLOATING DURING NON-ACCESS MODE FOR MEMORY ARRAYS

(75) Inventors: Tsung-Yung Chang, Hsin-Chu (TW);
Fatih Hamzaoglu, Portland, OR (US);
Gunjan H. Pandya, Portland, OR (US);
Siufu Chiu, San Jose, CA (US); Kevin Zhang, Portland, OR (US); Wei Chen, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 464 days.

(21) Appl. No.: 12/645,623

(22) Filed: Dec. 23, 2009

(65) Prior Publication Data

US 2011/0149666 A1 Jun. 23, 2011

(51) Int. Cl.
G11C 5/14 (2006.01)
G11C 7/12 (2006.01)
G11C 11/413 (2006.01)

(52) U.S. Cl.
CPC ........ *G11C 7/12* (2013.01); *G11C 5/141* (2013.01); *G11C 11/413* (2013.01)
USPC .......................... 365/229; 365/203; 365/207

(58) Field of Classification Search
USPC ............... 365/203, 189.09, 189.11, 226–229
See application file for complete search history.

(56) References Cited

U.S. PATENT DOCUMENTS

| | | | | |
|---|---|---|---|---|
| 6,169,419 B1 * | 1/2001 | De et al. | ............................ | 326/58 |
| 6,366,526 B2 | 4/2002 | Naffziger et al. | | |
| 6,925,025 B2 * | 8/2005 | Deng et al. | ...................... | 365/226 |
| 7,262,631 B2 * | 8/2007 | Chong | .............................. | 326/33 |
| 7,272,061 B2 * | 9/2007 | Saleh | ............................. | 365/203 |
| 7,385,435 B2 * | 6/2008 | Pham et al. | ................... | 327/534 |
| 7,414,911 B2 * | 8/2008 | Choi et al. | ..................... | 365/229 |
| 7,657,767 B2 * | 2/2010 | Rusu et al. | ...................... | 713/323 |
| 7,705,625 B2 * | 4/2010 | Yoo et al. | ......................... | 326/26 |
| 7,978,004 B2 * | 7/2011 | Houston et al. | ................ | 327/537 |
| 7,990,208 B2 * | 8/2011 | Mizuno et al. | ................ | 327/544 |
| 8,327,163 B2 * | 12/2012 | Chen | .............................. | 713/300 |
| 2007/0005999 A1 * | 1/2007 | Rusu et al. | ...................... | 713/300 |
| 2008/0285367 A1 * | 11/2008 | Jung et al. | ...................... | 365/203 |
| 2009/0172283 A1 * | 7/2009 | Khellah et al. | ................ | 711/118 |
| 2009/0207650 A1 | 8/2009 | Braceras et al. | | |
| 2009/0207655 A1 | 8/2009 | Kalnitsky et al. | | |
| 2010/0226191 A1 * | 9/2010 | Jung et al. | ...................... | 365/203 |
| 2011/0158021 A1 * | 6/2011 | Wiatrowski et al. | ........... | 365/203 |
| 2011/0187438 A1 * | 8/2011 | Yeung et al. | ................... | 327/419 |

* cited by examiner

*Primary Examiner* — Kretelia Graham
(74) *Attorney, Agent, or Firm* — Blakely, Sokoloff, Taylor & Zafman LLP

(57) ABSTRACT

Techniques are disclosed that allow for power conservation in integrated circuit memories, such as SRAM. The techniques can be embodied in circuitry that allows for floating of bitlines to eliminate or otherwise reduce power leakage associated with precharging bitlines. For instance, the techniques can be embodied in a bitline floating circuit having a single logic gate for qualifying the precharge control signal with a wake signal, so that precharging of the bitline does not occur if the wake signal is not in an active state. The techniques further allow for the elimination or reduction of unnecessary power consumption by the I/O circuitry or the memory array, such as when the memory array is not being accessed or when the array or a portion thereof is permanently disabled for yield recovery.

20 Claims, 9 Drawing Sheets

US 8,982,659 B2

BITLINE FLOATING DURING NON-ACCESS MODE FOR MEMORY ARRAYS

BACKGROUND

Minimizing the leakage power consumption and improving the reliability of memory arrays such as static random access memory (SRAM) arrays are among current design challenges of microprocessors with large on-die caches. One source of leakage power is associated with the bitlines. Traditionally, the bitlines of such arrays are precharged to full Vcc when the arrays are not accessed or in sleep mode. However, this bitline precharging is associated with various problems including power leakage, as well as other less recognized issues relevant to design limitations.

Conventional techniques for addressing the leakage problem include reducing the bitline voltage, by using n-channel metal oxide semiconductor (NMOS) and p-channel metal oxide semiconductor (PMOS) prechargers in combination, which effectively limit the bitlines at a threshold voltage drop from Vcc when the arrays are not accessed. However, such conventional techniques tend to significantly increase design overhead and generally provide inadequate leakage reduction. What is needed, therefore, are techniques for power conservation for integrated circuit memories.

DETAILED DESCRIPTION

Figure 1:
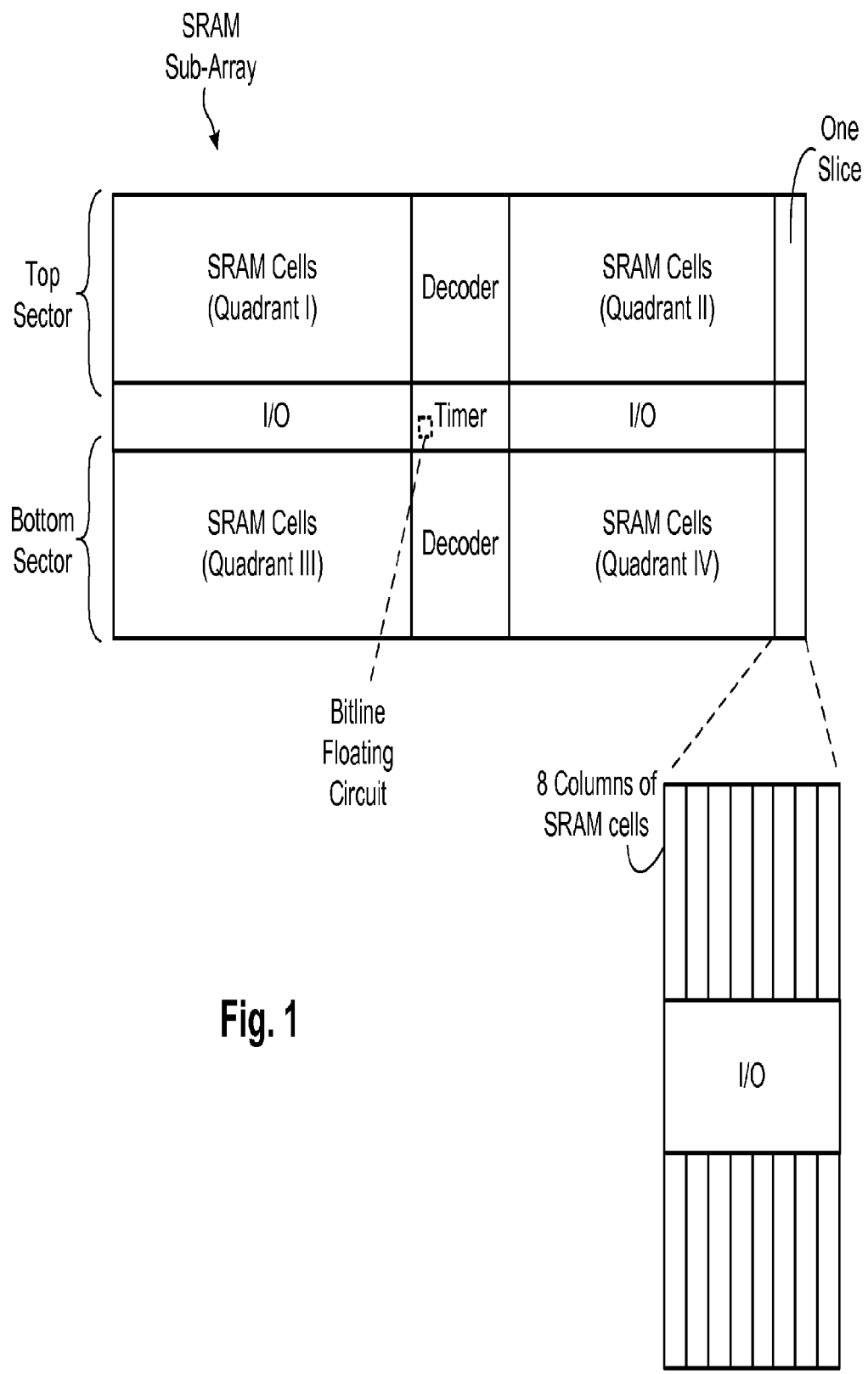
FIG. 1 is a block diagram of an example memory array configured with a bitline floating circuit configured in accordance with an embodiment of the present invention.

Techniques are disclosed that allow for power conservation in integrated circuit memories, such as SRAM. The techniques can be embodied in circuitry that allows for floating of bitlines to eliminate or otherwise reduce power leakage associated with precharging bitlines, without incurring significant design limitations. For instance, the techniques can also be embodied in circuitry that allows for the elimination or reduction of unnecessary power consumption by the input/output (I/O) circuitry of the memory array, such as when the memory array is not being accessed or when the array or a portion thereof is permanently disabled for yield recovery. The techniques can be embodied, for example, in discrete memory devices (e.g., SRAM chips), integrated system designs (e.g., purpose-built silicon), or on-chip memory (e.g., microprocessor with on-chip cache).

General Overview

The common practice of precharging bitlines is associated with a number of issues. For example, excessive leakage at the bitlines occurs from the on-state precharge transistor (typically in the column select circuit), through the bitline and the off-state passgate in the bit cell and to the on-state transistor in the word line driver. Another issue incurred by precharging a bitline to full Vcc is that it limits design flexibility and effectively discourages certain beneficial functionality (such as power conservation circuitry).

For example, precharging a bitline to full Vcc precludes the addition PMOS sleep transistors to the cache column circuitry, such as the column multiplexers (muxes), write drivers and sense amplifiers. For instance, PMOS read column muxes could, for example, accidentally be turned on when the sub-arrays are inactive and the virtual Vcc of the cache column circuitry drops below a threshold voltage from Vcc, or otherwise drifts down to a state the PMOS circuitry may perceive as an active state (logic low). Another issue associated with precharging bitlines to full Vcc is that long-term exposure to precharging accelerates the oxide wear-out for the passgates in the bit cell.

As such, and in accordance with an embodiment of the present invention, by selectively floating the bitlines when the corresponding arrays are not accessed, the leakage of the overall memory array is significantly reduced (e.g., by 30% to 60%, or more). In addition, given the manner in which the bitline floating is achieved, a PMOS-based power conserving sleep mode of the cache column circuitry is enabled. The techniques disclosed herein can be embodied, for example, in a bitline floating circuit that is operatively coupled with, or otherwise integrated into, any number of SRAM memory circuit configurations susceptible to leakage related to bitline precharging.

The benefits of employing the disclosed techniques over conventional techniques, such as using NMOS and PMOS prechargers in combination to limit the bitlines at a threshold voltage drop from Vcc when the arrays are not accessed, include less design overhead, more leakage reduction, and design flexibility for the sleep mode design in the cache column circuitry. The bitline floating circuit can be included, for example, in discrete memory devices (e.g., SRAM memory chips) or on-chip memory (e.g., microprocessor with on-chip SRAM cache, or purpose-built silicon).

In one example embodiment, a bitline floating circuit is configured with OR-gate logic and a wake signal to enable the bitline floating. The conventional precharge control signals of the precharger circuitry (e.g., PMOS transistors) are qualified by the complement of a wake signal through the OR-gate logic. Depending on the sleep design resolution, the two conventional precharge signals can be controlled, for instance, by the same wake signal or two separate wake signals. In other embodiments, the bitline floating circuit can be implemented with other logic such as AND-gates. In a more general sense, the bitline floating circuit can be implemented with a single logic gate (e.g., a single OR-gate, or AND-gate, etc) to qualify an existing precharge control signal by a wake signal. As will be appreciated, the type of logic gate will depend on factors such as the active state of the existing precharge control signal and the wake signal.

The design overhead to enable bitline floating in accordance with this example embodiment is minimal, as the bitline floating circuit can be merged with existing circuitry, such as in the timer or other conventional component of SRAM arrays. The bitline leakage power can be reduced, for example, by approximately 60%. Further power savings can be obtained through use of sleep circuitry. Although numerous applications for memory configured with the bitline floating circuit as described herein will be apparent, memory arrays used in server applications may be of particular interest, and especially those server applications where the power supply of the cache is set at a fixed value to minimize $Vcc_{min}$ issues. The projected power saving is significant so that it can be used, for instance, in various server products to improve the top bin yield.

Memory Array

FIG. 1 is a block diagram of an example memory array configured with a bitline floating circuit configured in accordance with an embodiment of the present invention.

As can be seen, this example embodiment is actually a sub-array that can be repeated a number of times to make up an overall memory array. For example, the overall memory array can be a 1 Mbyte cache (or other on-chip memory of a processor) that includes 64 16 Kbyte sub-arrays configured as shown. Any number of suitable array and sub-array sizes can be used, depending on particulars of the application at hand. Further note that the overall array may be a single sub-array.

The physical layout of the sub-array can vary as well, as will be appreciated. In this example embodiment, each sub-array is effectively divided into top and bottom sectors. Each sector includes two quadrants of SRAM cells, wherein the top sector includes quadrants I and II and the bottom sector includes quadrants III and IV. The SRAM cells are configured in slices/columns. As can be further seen, each slice of this example configuration includes eight columns of SRAM cells. The number of slices per quadrant can vary, and in one example configuration is between 8 and 18 slices per quadrant. Similarly, the number of SRAM cells per column of one quadrant can vary, and in one example embodiment is between 64 up to 512. In one specific case, there are 16 slices per quadrant, and 256 SRAM cells per column of one quadrant.

At the center of each slice is the I/O circuitry, which includes read/write column multiplexers, bitline prechargers, sense amplifiers, and write drivers. At the center of the sub-array are decoders and a timer. The timer includes a bitline floating circuit. In other embodiments, the bitline floating circuit can be implemented in a discrete fashion (separate from the existing components). Alternatively, the bitline floating circuit may be integrated into existing components other than the timer, such as in the decoder circuitry or the I/O circuitry corresponding to the SRAM cells being provided with the functionality of the bitline floating circuit.

Numerous memory cell types and array layout architectures can be used here, as will be apparent in light of this disclosure, and the claimed invention is not intended to be limited to any particular one. In general, the bitline floating circuit as described herein can be used with any memory arrays having precharged bitlines and/or I/O circuitry that can be put in a low power consumption (or no power consumption), or so-called sleep mode, when the circuitry is not actively being used. Other memory array layouts can have, for example, a single array of memory cells, with a single decoder and I/O circuitry that services the entire array (instead of a quadrant-based layout having top and bottom sectors). The memory array type can be, for instance, SRAM or Flash, and may be volatile, non-volatile, and erasable/reprogrammable, depending on the target application and desired performance (e.g., read/write speed, reading v. writing balance such as the case where reading occurs 80% of the time and writing only 20% of the time, etc).

In general, each SRAM cell is capable of storing one bit of information, and is either set to a logic high or logic low state. Each SRAM cell can be implemented as conventionally done, using any number of typical SRAM configurations. For example, the SRAM cells may be configured as 6-T, 8-T, 10-T SRAM cells, or with any number of transistors desired per bit. Likewise, the SRAM cells can be configured with a single R/W port, or with separate read and write ports. In other embodiments, note that the memory cell may be configured with other memory cell technology, such as flash (e.g., NAND or NOR flash), or read-only memory (ROM) memory cells.

In this example array layout configuration, the decoders are sandwiched between quadrants of SRAM cells, and include the final decoder and word line driver, which can be implemented as conventionally done. There is a decoder for the top sector, and one for the bottom sector of the sub-array. For each read or write access, an address is provided to the sub-array. In general, the decoders are configured to decode the address, and to turn on the selected SRAM entry (or row) during each read or write access of the memory array. In one specific configuration, the address is decoded by the corresponding decoder into an address word line signal and a column select signal. The address word line signal identifies a particular row in the sub-array, and the column select signal identifies a particular column of the sub-array. The read/write column mux (of the I/O circuitry) receives the column select signal and turns on the corresponding column for read or write. Rows and columns not relevant to the read/write access operation are effectively deselected by the decoders.

The timer includes circuitry for generating the various clock signals for sub-array to be functional, including the precharge clock/control signals. The timer can be implemented as typically done, using any number of suitable timer configurations. As will be appreciated, the timer configuration will vary from one array to the next, as it is designed specifically based on the timing specification of a particular array. In general, the timer typically includes logic gates to derive the array clocks from global clock(s), and ensure the timing relationship between those different array clocks to make the sub-arrays function properly. In this example embodiment, the timer includes a bitline floating circuit.

The bitline floating circuit enables power conservation, by allowing for floating of bitlines to eliminate or otherwise reduce power leakage associated with precharging bitlines, and may also allow for the elimination or reduction of unnecessary power consumption by the I/O circuitry, such as when the memory array is not being accessed or when the array or a portion thereof is permanently disabled for yield recovery. In contrast, when the SRAM array is not accessed in typical configurations, the I/O circuitry continues to consume power. The bitline floating circuit will be discussed in more detail with reference to FIGS. 2-5. In addition, and as previously explained, the I/O circuitry includes read/write column multiplexers, bitline prechargers, sense amplifiers, and write drivers.

In typical SRAM memory arrays, read/write column multiplexers (or muxes) can be used to improve the array efficiency by sharing a sense amplifier and/or write driver with multiple columns of memory cells. There may be, for example, a read/write column mux for each slice (8 columns), thereby providing an 8:1 (columns:mux) sharing ratio. Other configurations may have a single read/write column mux for the entire array. In any such cases, during each read/write access, the read/write column mux will turn on the selected column for read or write, and deselect the other columns associated with that mux. In other embodiments having no read/write column mux, there can be a dedicated sense amplifier and/or write driver for each column.

The bitline prechargers are for precharging the local bitlines of the memory array, for example, to Vcc (or other suitable voltage level) when there is no read or write access. They are commonly implemented with PMOS field effect transistors (FETs). During each read operation, the target bitline is discharging when a logic 0 is being read from the bitline, or staying at Vcc when a logic 1 is being read from the bitline. Because of loading of the local bitline, the bitline may discharge slowly. A sense amplifier can be used to detect the small signal difference between two bitlines attached to the same SRAM cell, thereby distinguishing between a logic high or logic low states. During a write operation, on the other hand, a write driver can be used to send the desired logic state into the SRAM cell, thereby allowing either a logic 0 or a logic 1 to be written to that cell.

Each of the read/write column muxes, bitline prechargers, sense amplifiers, and write drivers can be implemented with conventional technology, and the claimed invention is not intended to be limited to particular configurations of I/O circuitry. Rather, any number of I/O circuitry can be used with an embodiment of the present invention, as will be appreciated in light of this disclosure.

Figure 2:
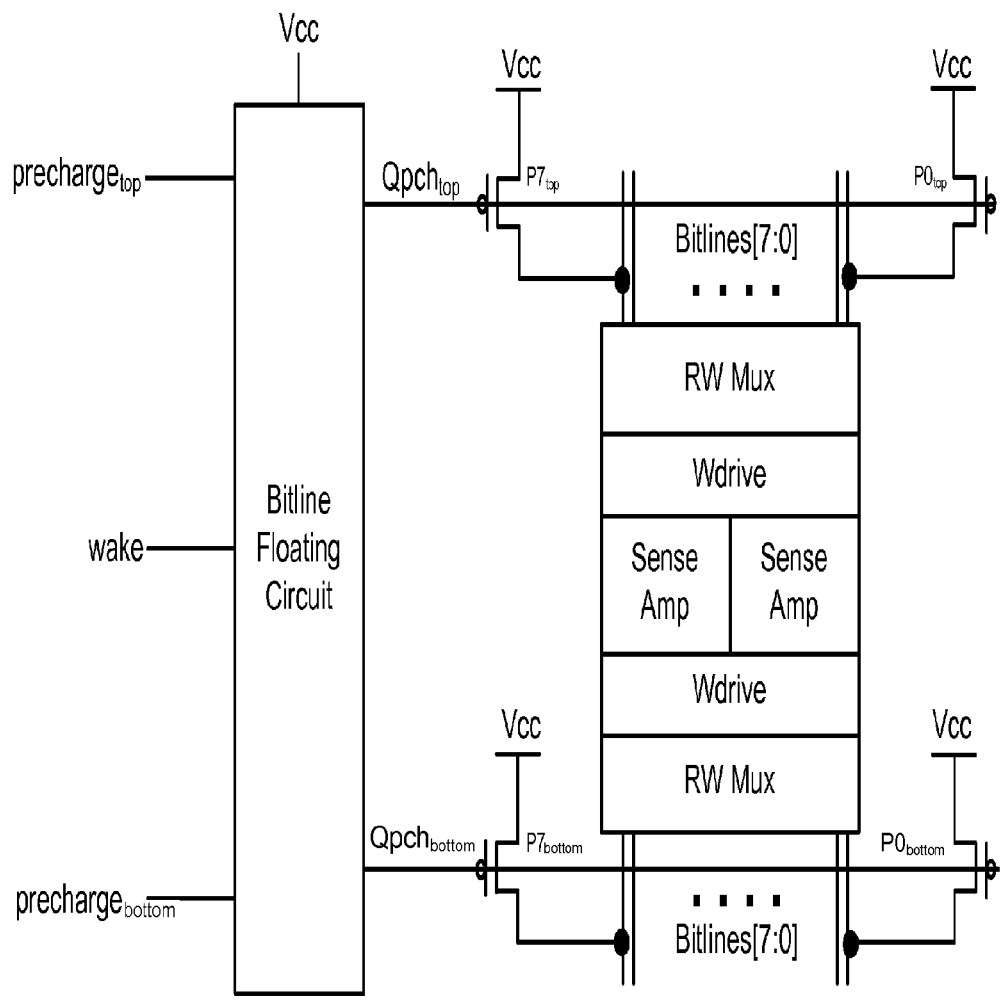
FIG. 2 is a block diagram showing an example memory array having a bitline floating circuit configured in accordance with an embodiment of the present invention.

FIG. 2 is a block diagram showing an example memory array having a bitline floating circuit configured in accordance with an embodiment of the present invention. One slice (or 8 columns and corresponding I/O circuitry in this example) of a sub-array is shown, but the other slices or portions of the sub-array (or overall array) can be similarly coupled, as will be appreciated.

As can be seen, the bitline floating circuit is operatively coupled to the sub-array, wherein control signals of the bitline prechargers are qualified by the bitline floating circuit using a wake signal. In more detail, the timer of the I/O circuitry generates control signals $precharge_{top}$ and $precharge_{bottom}$. The control signal $precharge_{top}$ would conventionally be used to directly control bitline prechargers $P0_{top}$ to $P7_{top}$ for top sector, and the control signal $precharge_{bottom}$ would conventionally be used to directly control bitline prechargers $P0_{bottom}$ to $P7_{bottom}$ for bottom sector. However, and in accordance with an embodiment of the present invention, qualification of these conventional control signals by the bitline floating circuit allows for the precharging of the bitlines to be limited to when the sub-array in not in sleep mode (or when the wake signal is active, meaning that a read or write access request has been received by the array).

In this example configuration, the bitline prechargers $P0_{top}$ to $P7_{top}$ and $P0_{bottom}$ to $P7_{bottom}$ are implemented with PMOS field effect transistors (FETs), and are connected between the power supply (Vcc) and the local bitlines (bitlines[7:0]). However, any suitable bitline precharging circuitry can be used to precharge the bitlines, whether implemented in complementary metal oxide semiconductor (CMOS) or bipolar junction transistor (BJT) or heterojunction bipolar transistor (HBT) or any other technology that can be used to provide bitline precharge circuitry capable of being turned on or otherwise activated by a control signal that can be qualified as described herein. Note that with PMOS FETs, the corresponding control signals are active low (i.e., switch turns on when gate is low), so the complements of the $precharge_{top}$ and $precharge_{bottom}$ can be used, assuming a differential signal scheme is employed.

To enable a floating bitline, the bitline floating circuit can be implemented, for example, in the timer of the I/O circuitry. However, as previously explained, the bitline floating circuit may be integrated into existing components other than the timer (such as in the decoder circuitry or the I/O circuitry), or may be implemented as a discrete device. In any case, the bitline floating circuit can be configured to intercept the existing precharge clock/control signals generated by the timer ($precharge_{top}$ and $precharge_{bottom}$), and generate qualified precharge signals $Qpch_{top}$ and $Qpch_{bottom}$, which can then be sent to the I/O circuitry to control the bitline prechargers ($P0_{top}$ to $P7_{top}$ and $P0_{bottom}$ to $P7_{bottom}$).

Typical I/O circuitry is also provided, as shown in FIG. 2, including read/write column multiplexers (RW Mux), bitline prechargers ($P0_{top}$ to $P7_{top}$ and $P0_{bottom}$ to $P7_{bottom}$) sense amplifiers (Sense Amp), and write drivers (Wdrive). The previous disclosure relevant to these items made with reference to FIG. 1 is equally applicable here. In addition, and as can be seen in FIG. 2, the sub-array layout is configured as previously discussed with reference to FIG. 1, including upper and bottom sectors, and 8 column slices. Further note the sub-array is configured with differential circuitry as commonly done. The complementary circuitry is not shown, but will be apparent in light of this disclosure. Other embodiments may be implemented with single ended circuitry.

Bitline Floating Circuit

Figure 3:
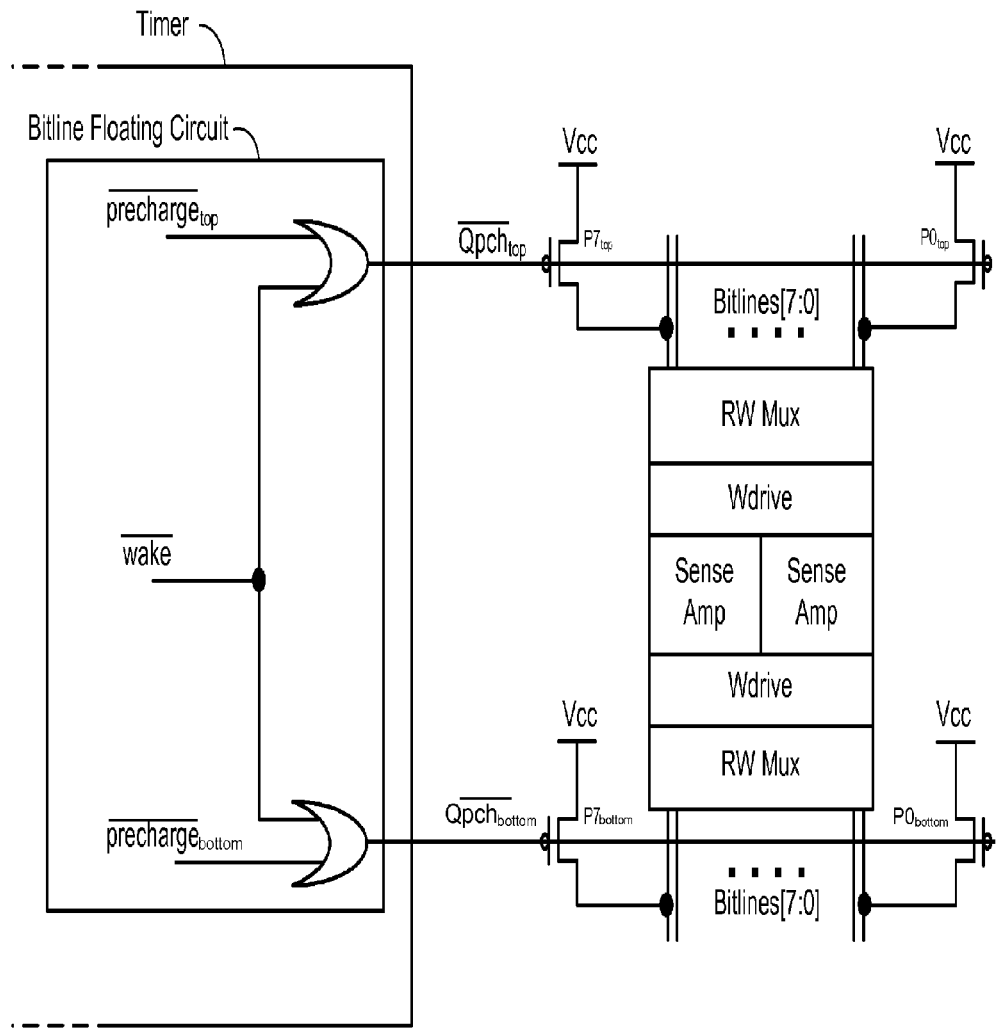
FIG. 3 is a schematic diagram of an example bitline floating circuit operatively coupled with an example memory array, in accordance with an embodiment of the present invention.

FIG. 3 is a schematic diagram of an example bitline floating circuit operatively coupled with an example memory array, in accordance with an embodiment of the present invention.

As can be seen, the bitline floating circuit of this example embodiment is implemented in the timer of the I/O circuitry, and includes a pair of OR-gates. The control signals of PMOS bitline precharger circuits ($P0_{top}$ to $P7_{top}$ and $P0_{bottom}$ to $P7_{bottom}$) are qualified by a wake signal (or actually, the complement of the wake signal ($\overline{wake}$) given the operation of PMOS FETs) through the OR logic of the bitline floating circuit. To assist in the discussion, Tables 1 and 2 are provided, which respectively demonstrate the operation of the OR-gates of the bitline floating circuit, and the PMOS FETs used to implement the bitline precharger circuits ($P0_{top}$ to $P7_{top}$ and $P0_{bottom}$ to $P7_{bottom}$) in accordance with one specific example embodiment of the present invention.

TABLE 1

OR-gate Logic

| Input A: $precharge_x$ | Input B: wake | Output: $Qpch_x$ |
| --- | --- | --- |
| low | low | low |
| low | high | high |
| high | low | high |
| high | high | high |

TABLE 2

PMOS FET Switching

| Gate | Switch State |
| --- | --- |
| low | On (closed) |
| high | Off (open) |

Thus, note that the corresponding PMOS bitline precharger circuits (e.g., $P0_{top}$, $P1_{top}$ . . . , $P7_{top}$, or $P0_{bottom}$, $P1_{bottom}$ . . . , $P7_{bottom}$) are only turned on when the $\overline{wake}$ is logic low (meaning that the wake signal is logic high, and therefore a read/write operation is active) and the $precharge_x$ (i.e., $precharge_{bottom}$ or $precharge_{top}$) signal generated by the timer is logic low. Note that the active state of the $precharge_x$ signals is logic low (which works well with PMOS bitline prechargers). To this end, and assuming a differential configuration, the complement of the precharge$_x$ signals (i.e., $\overline{\text{precharge}_{top}}$ and $\overline{\text{precharge}_{bottom}}$) could be used (meaning that the precharge$_{bottom}$ or precharge$_{top}$ signal is logic high, and therefore bitline precharging is activated).

Thus, the qualified precharge signals Qpch$_{top}$ and Qpch$_{bottom}$ are also active low. Thus, continuing with a differential configuration, they can be indicated as $\overline{\text{Qpch}_{top}}$ and $\overline{\text{Qpch}_{bottom}}$. If either or both the wake or precharge$_x$ signals are logic high, then the qualified precharge signals ($\overline{\text{Qpch}_{top}}$ and $\overline{\text{Qpch}_{bottom}}$) will also be high, and the corresponding PMOS bitline prechargers will therefore be turned off. As such, Vcc is disconnected from the corresponding bitlines (e.g., bitlines [7:0]), and therefore the bitlines are allowed to float (as opposed to being pre-charged to full Vcc). This reduces leakage power of the array.

Other suitable logic schemes will be apparent in light of this disclosure, depending on factors such as the active state of the control signal and whether p-type or n-type semiconductors are employed. As such, the claimed invention is not intended to be limited to any particular one configuration. For instance, in a configuration using NMOS FETs for the bitline prechargers and the active state of the precharge$_x$ signals is logic high, the OR-gates or the bitline floating circuit could be replaced with AND-gates. The qualified precharge signals Qpch$_{top}$ and Qpch$_{bottom}$ would also be active high. In such a configuration, the wake signal could be used instead of $\overline{\text{wake}}$; likewise, precharge$_x$ signals could be used instead of $\overline{\text{precharge}_x}$ signals. Thus, if either or both the wake or precharge$_x$ signals are logic low, then the qualified precharge signals (Qpch$_{top}$ and Qpch$_{bottom}$) will also be low, and the corresponding NMOS bitline prechargers will therefore be turned off. Tables 3 and 4 respectively demonstrate the operation of the AND-gates of the bitline floating circuit, and the NMOS FETs used to implement the bitline prechargers (P0$_{top}$ to P7$_{top}$ and P0$_{bottom}$ to P7$_{bottom}$), in accordance with one such embodiment of the present invention.

TABLE 3

AND-gate Logic

| Input A: precharge$_x$ | Input B: wake | Output: Qpch$_x$ |
|---|---|---|
| low | low | low |
| low | high | low |
| high | low | low |
| high | high | high |

TABLE 4

NMOS FET Switching

| Gate | Switch State |
|---|---|
| low | Off (open) |
| high | On (closed) |

In addition, depending on the sleep design resolution, the two precharge signals (i.e., precharge$_{bottom}$ or precharge$_{top}$) can be controlled by the same wake signal, or two separate wake signals. For example, in a configuration having two wake signals such as wake$_{bottom}$ and wake$_{top}$, the top sector may continue to sleep when bottom sector is accessed. Further note that the design overhead to enable bitline floating is minimal, as the additional logic can be readily merged with existing logic in the timer, or other logic included in the existing array architecture. Further note that the additional logic can be a single logic gate (e.g., single OR-gate, or a single AND-gate, etc) for each precharge control line to be qualified with a wake signal, as described herein.

Sleep/Shut-Off Circuitry

Figure 4A:
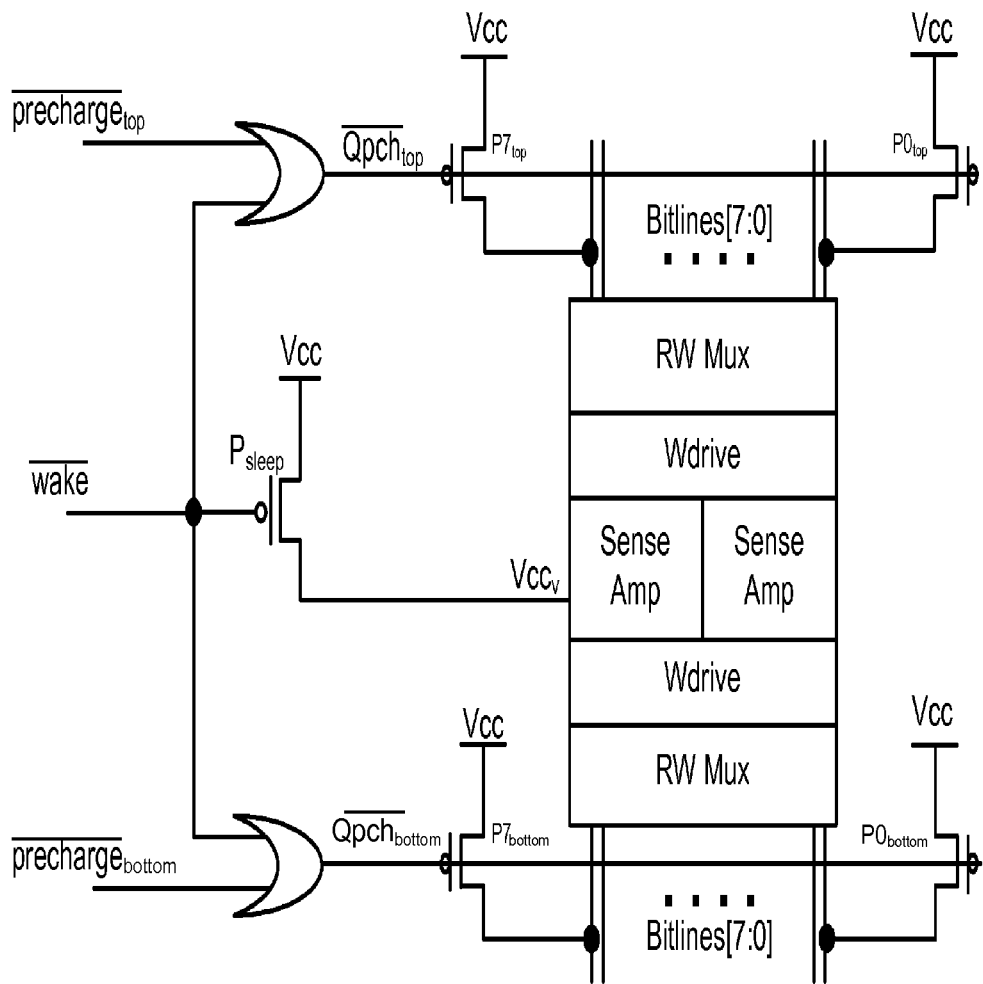
FIGS. 4a-d each show a schematic diagram of an example bitline floating circuit operatively coupled with an example memory array and sleep/shut-off circuitry, in accordance with an embodiment of the present invention.
Figure 4B:
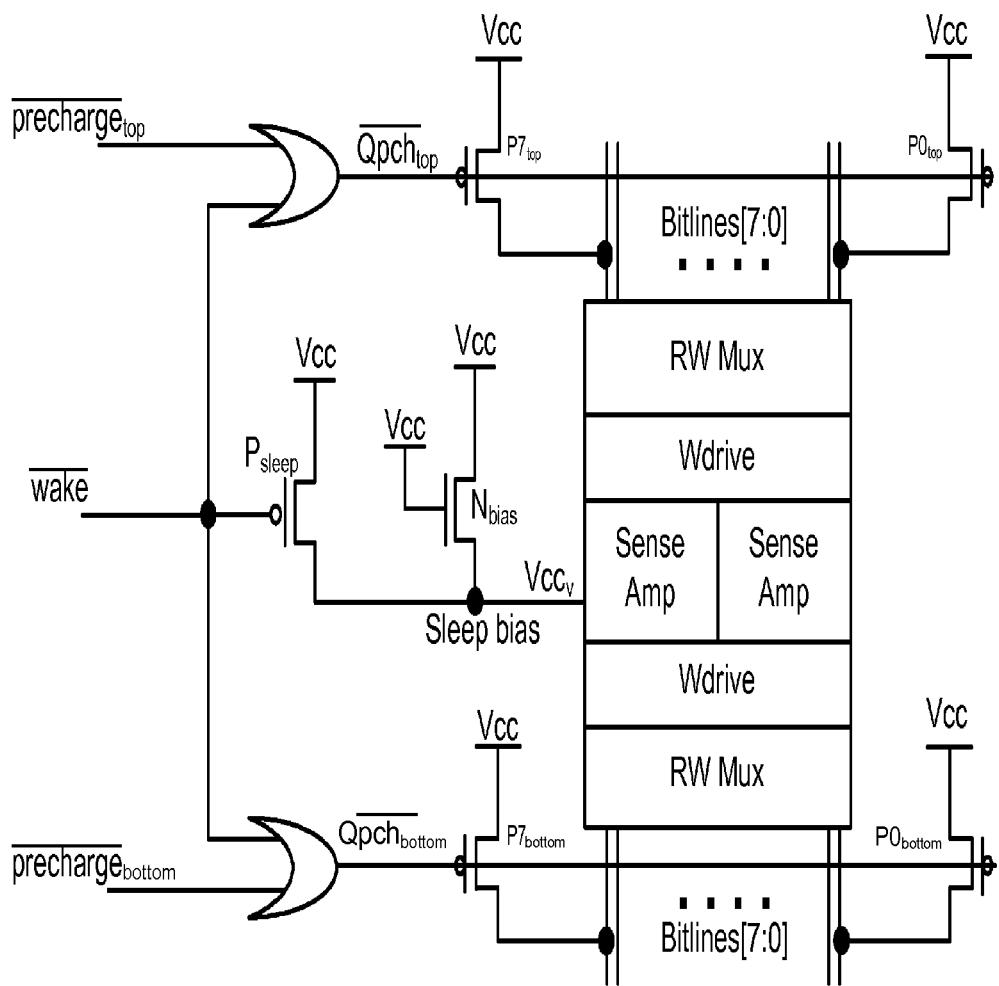
Figure 4C:
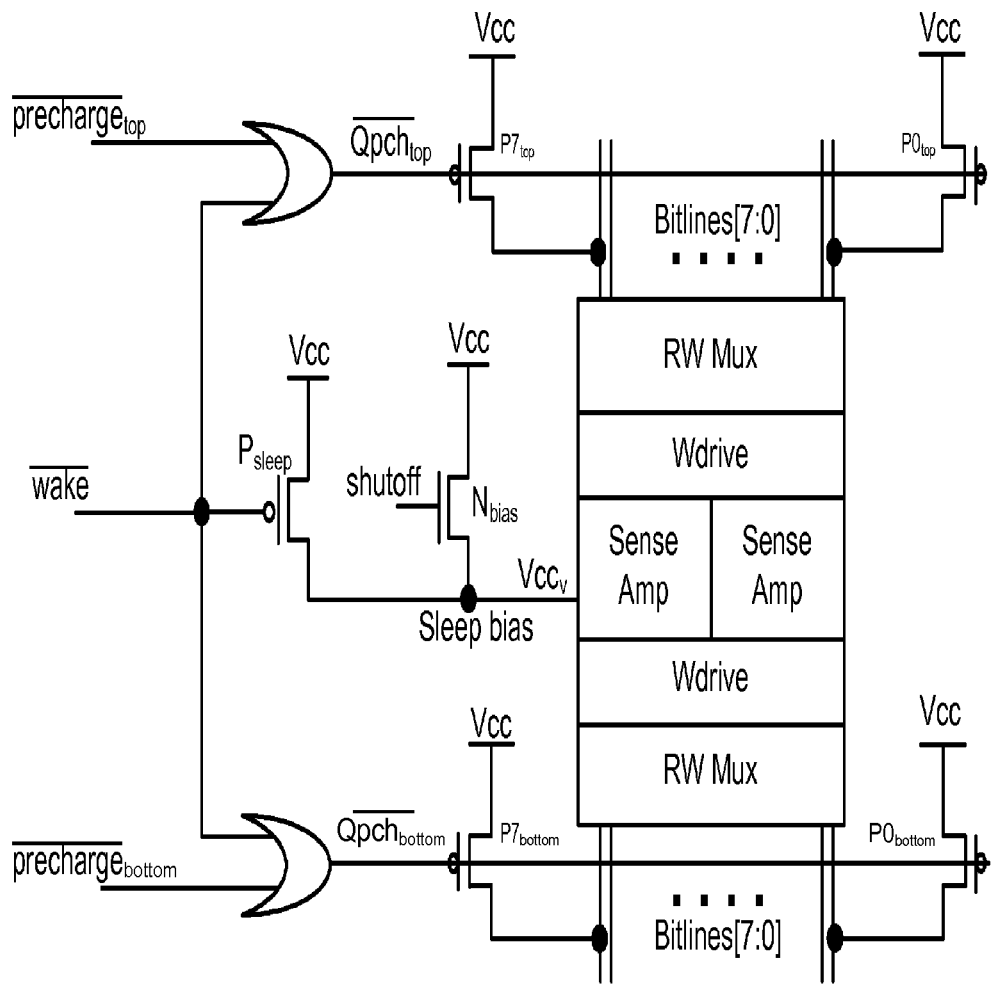

With a floating bitline configuration as described herein, the virtual Vcc of the memory array column circuitry can be adjusted to any level without creating any issues such as drive fight and bitline precharge/equalizing timing. In general, virtual Vcc is the voltage on the Vcc$_v$ node when the device is in sleep mode, and normal Vcc (nominal power) is disconnected. For instance, virtual Vcc can be a value between Vcc (e.g., 1.0 to 1.5V) and Vss (e.g., −0.5 to 0.5V). As will be appreciated in light of this disclosure, limiting the difference between nominal power and virtual power at the Vcc$_v$ node has certain advantages, and reduces power consumption through the use of a lower voltage level. FIGS. 4a-c each show a schematic diagram of an example bitline floating circuit operatively coupled with an example memory array and sleep/shut-off circuitry that has a virtual Vcc node (Vcc$_v$), in accordance with an embodiment of the present invention.

The sleep/shut-off circuitry can be implemented, for example, in the timer along with the bitline floating circuitry as previously described. Alternatively, the sleep/shut-off circuitry can be implemented apart from the bitline floating circuitry, such as in the I/O circuitry or other suitable location within the memory device, or as a discrete component operatively coupled to the I/O circuitry. In any case, the sleep/shut-off circuitry can be used to reduce leakage power in the array, by allowing the I/O circuitry to be selectively powered when the array is being accessed.

Typically, the I/O circuitry of a memory array is connected directly to Vcc. As such, when the memory array is not being accessed, the I/O circuitry will continue to consume power (e.g., leakage power, maintenance of biasing, etc). In addition, some sub-arrays or other portion of the memory array (such as in the case of a large on-die cache) might be permanently disabled (due to defects) in effort to recover yield; thus, I/O circuitry associated with that defective portion will still consume power. Furthermore, some of the I/O circuitry (such as sense amplifier output driver) might be needed for high frequency operation, and thus might be designed with nominal transistors rather than low leakage transistors, thereby further increasing power consumption.

In accordance with an embodiment of the present invention, techniques are provided to reduce power consumption from the I/O circuitry if the memory array (or sub-arrays) are not accessed or are permanently disabled for yield recovery. For instance, the sleep/shut-off circuitry can be used to reduce power leakage in the array, by disconnecting the I/O circuitry from its power supply (e.g., Vcc) when the array is not being accessed or is permanently disabled for yield recovery.

FIG. 4a illustrates sleep/shut-off circuitry that allows the I/O circuitry (including read/write column multiplexers, bitline prechargers, sense amplifiers, and write drivers) to be selectively coupled to its power supply (Vcc) through a sleep transistor (P$_{sleep}$), whose input is controlled by a wake signal. The previous disclosure with respect to componentry making up the I/O circuitry and the bitline floating circuit, as well as the array and sub-array architecture, is equally applicable here (and also equally applicable for embodiments shown in FIGS. 4b and 4c).

When the sub-array is not accessed or permanently disabled, the wake signal is set to logic 0 (and its complement $\overline{\text{wake}}$ is set to logic 1). As a result, the power supply Vcc is disconnected from the Vcc$_v$ node and the leakage power through the I/O circuitry is reduced. Note that once Vcc is disconnected, the potential on the $Vcc_v$ node may effectively float or otherwise drift downward as the capacitance associated with the $Vcc_v$ node discharges any stored charge. On the other hand, when the sub-array array is accessed, the wake signal is set to logic 1 (and its complement $\overline{wake}$ is set to logic 0). The timing of this signal change can vary from one embodiment to the next. In example case, for instance, the wake signal is set to logic 1 (and $\overline{wake}$ to logic 0) at least one cycle before the read/write access (or sometime prior to that access), and then held at that state until at least the end of the read/write access is reached (e.g., as indicated by a preset passage of time, or by an acknowledgement signal indicating the access is complete). In any case, when the wake signal is logic high (and $\overline{wake}$ is logic low), the sleep transistor $P_{sleep}$ is turned on and connects the power supply Vcc to the $Vcc_v$ node. This in turn allows the sub-arrays of the memory device to be accessed. As previously discussed, if an NMOS sleep transistor were used, note that the wake signal could readily be used to control it (instead of $\overline{wake}$). Other such variations and suitable logic schemes will be apparent in light of this disclosure.

Figure 4D:
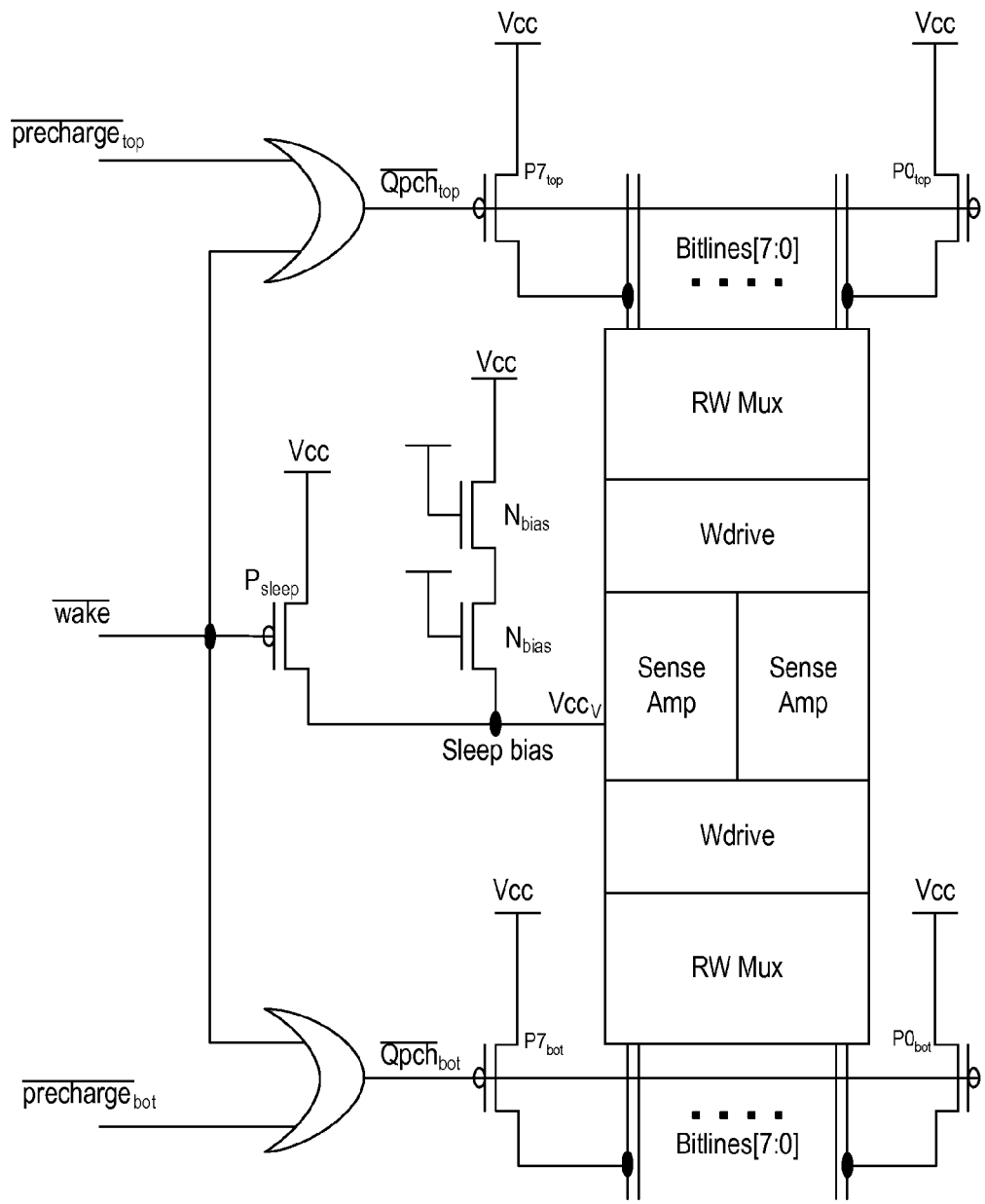

FIG. 4b demonstrates how an NMOS FET diode structure (transistor $N_{bias}$) can be coupled to the $Vcc_v$ node, in accordance with another embodiment of the present invention. This effective diode structure can be used to limit the virtual Vcc ($Vcc_v$) to be about Vcc less the threshold voltage of an NMOS FET. By biasing the $Vcc_v$ node in this manner, the dynamic power and di/dt noise associated with switching the array I/O circuitry in and out of sleep mode can be limited to the impact of switching $Vcc_v$ between Vcc (nominal power level during normal mode) and $Vcc-V_{tn}$ (virtual power level during sleep mode), where $V_{tn}$ is the threshold voltage of an NMOS FET. Other transistor types can be used to implement transistor $N_{bias}$ as will be appreciated in light of this disclosure. In addition, multiple diode structures as illustrated in FIG. 4d could be used to effect a greater drop from nominal power, if so desired. For instance, if x diode structures are serially connected between the $Vcc_v$ node and Vcc, each diode structure having a $V_{tn}$ of 0.4 V, then the sleep bias at the $Vcc_v$ node would be at Vcc-x(0.4V). The number of threshold voltages the sleep bias is set below Vcc will depend on factors such as desired noise performance as well as the value of the lowest sleep bias that can be used without causing unintentional switching (particular in PMOS circuitry).

FIG. 4c demonstrates that the input of the NMOS FET diode structure (transistor $N_{bias}$ of FIG. 4b) can be controlled by a control signal (in this example case, shut-off or its complement, $\overline{shut-off}$). In accordance with one such embodiment, the $\overline{shut-off}$ signal can be set to logic 0 (meaning that the shut-off signal is logic high, thereby indicating shut-off is enabled) for the sub-arrays that are permanently disabled for die level yield recovery. In operation, a logic 0 at the gate of the transistor $N_{bias}$ will turn that transistor off, thereby disconnecting Vcc from the $Vcc_v$ node and preventing generation of the sleep bias (e.g., $Vcc-V_{tn}$). On the other hand, the $\overline{shut-off}$ signal can be set to logic 1 for the functional sub-arrays (meaning that the shut-off is disabled), which causes transistor $N_{bias}$ to turn on and provides a sleep bias (e.g., $Vcc-V_{tn}$) as previously explained. Thus, the embodiment of FIG. 4c allows the $Vcc_v$ node to effectively be disconnected from the Vcc power supply for the disabled sub-arrays and thus minimizes the leakage power consumption, or alternatively allows a virtual potential at the $Vcc_v$ node (in the example shown, $Vcc-V_{tn}$) for functional sub-arrays, so that the dynamic power and the di/dt noise of switching the array I/O circuitry between sleep and normal modes can be contained or otherwise reduced.

Leakage power consumption can be reduced, for example, by 50% or more (relative to the same array configuration with no sleep mode) when implementing a p-sleep shut-off mechanism in the array I/O circuitry designed with nominal transistors, in accordance with one embodiment of the present invention. If the same I/O circuitry is designed with low-leakage transistors, the leakage power consumption of the I/O circuitry configured with a p-sleep shut-off mechanism as provided herein can be reduced by about 25% (relative to the same array configuration with no sleep mode).

Figure 5:
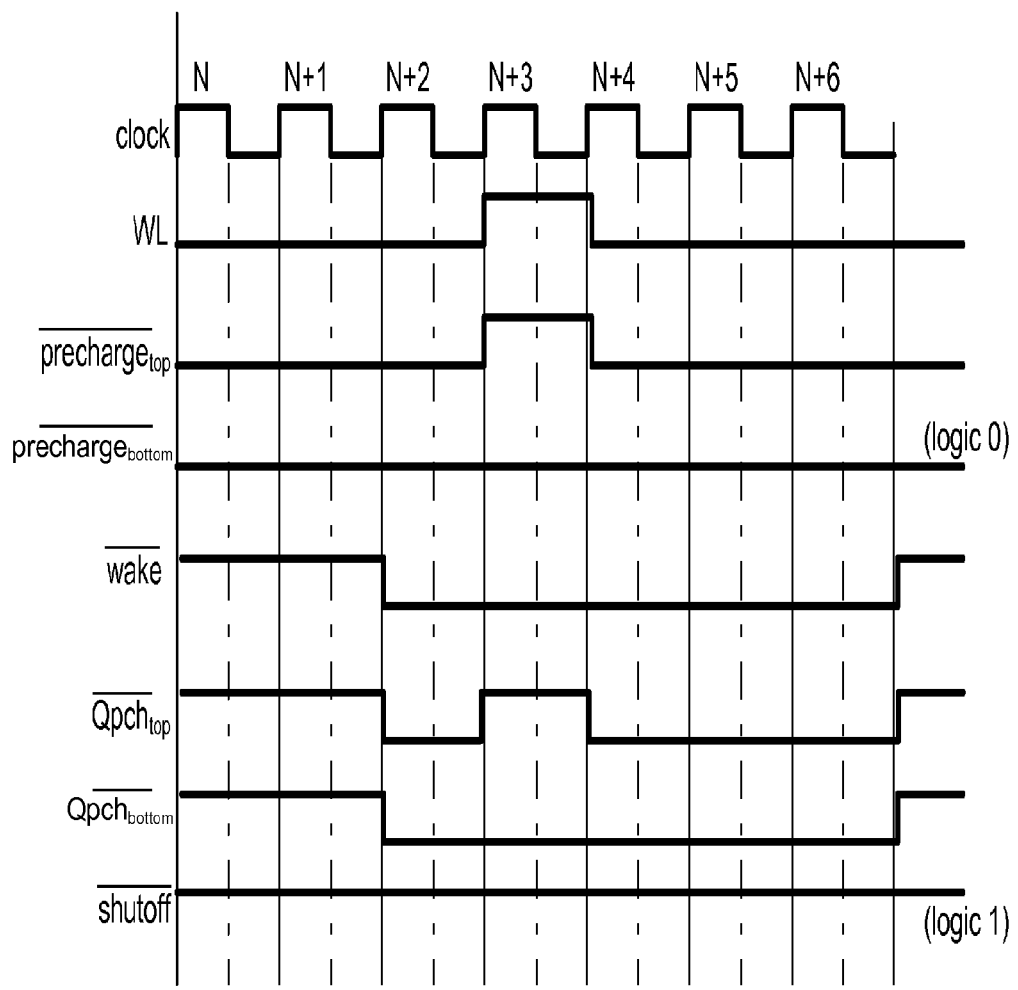
FIG. 5 is a timing diagram that shows the operation of an example memory array configured with a bitline floating circuit and sleep circuitry, in accordance with an embodiment of the present invention.

FIG. 5 is a timing diagram that shows the operation of an example memory array configured with a bitline floating circuit and sleep circuitry, in accordance with an embodiment of the present invention. The clock signal is provided as a reference for the other signals shown, including the address word line (WL) signal, the $\overline{wake}$ signal, the $\overline{precharge_{top}}$ and $\overline{precharge_{bottom}}$ signals, the $\overline{Qpch_{top}}$ and $\overline{Qpch_{bottom}}$ signals, and the $\overline{shutoff}$ signal. Other embodiments may utilize fewer signals (e.g., one precharge signal, as opposed to top and bottom precharge signals) or more signals (e.g., additional wake signals, depending on sleep resolution, as previously explained).

The address word line (WL) signal is generated by the decoder, the $\overline{precharge_{top}}$ and $\overline{precharge_{bottom}}$ signals are generated by the timer, and the $\overline{Qpch_{top}}$ and $\overline{Qpch_{bottom}}$ signals are generated by the bitline floating circuit, as previously explained. The wake signal (or in this example case, its complement $\overline{wake}$) can be derived, for example, from existing read/write enable signals and/or the array address of the target array. Alternatively, the memory array may be configured with a dedicated wake signal (or signals). In a more general sense, the wake signal can be any signal that can be set to an appropriate state (either logic high or logic low, depending on logic scheme employed) to indicate an impending read or write access of the array prior to that read/write access (e.g., at least one half cycle of the clock signal before access), and then held until at least the end of the access is reached. The wake signal can then be set to the other logic state to indicate a sleep mode is active (e.g., after 60 seconds of no access requests to the array).

The optional shut-off signal can effectively be used as a fuse signal to permanently shut-off the transistor $N_{bias}$ when the sub-array (or some corresponding portion of the array) has been deactivated due to defects identified during testing of the array. Thus, depending on the situation, the shut-off signal can be, for example, a permanent logic low (disabled portion of array) or a permanent logic high (active portion of array). In the example shown, the shut-off signal is tied to logic high, indicating that the corresponding sub-array (or other associated portion of the array) is active.

As can be seen in this example timing scenario, the $\overline{wake}$ is asserted (to logic low) at clock cycle N+2, which is one full clock cycle prior to the word line being asserted at N+3. At time N+2, the $\overline{precharge_{top}}$ and $\overline{precharge_{bottom}}$ signals are already active (logic low, in this example). As such, at time N+2, the $\overline{Qpch_{top}}$ and $\overline{Qpch_{bottom}}$ signals output by the bitline floating circuit switch to logic low. This assumes, for example, an embodiment such as the ones shown in FIG. 3, 4a, 4b, or 4c, using OR-gate logic, is being used. The logic low state of the $\overline{Qpch_{top}}$ and $\overline{Qpch_{bottom}}$ signals is applied to the corresponding bitline precharger circuits, thereby allowing the bitlines to precharge to Vcc prior to the word line (WL) being asserted, as previously discussed.

The word line WL is asserted and the read/write transaction completes at or just past clock cycle N+4. At that time, the $\overline{\text{precharge}_{top}}$ is de-asserted (changed to logic high) for about one clock cycle. As such, the $\overline{\text{Qpch}_{top}}$ signal is also de-asserted (changed to logic high), which in turn allows the corresponding bitline (or bitlines) to float, thereby conserving power. Any number of other scenarios will be apparent in light of this disclosure, where various bitlines are allowed to float, either as a result of the wake and/or precharge control signals changing to a state indicating the precharge is not needed.

System

Figure 6:
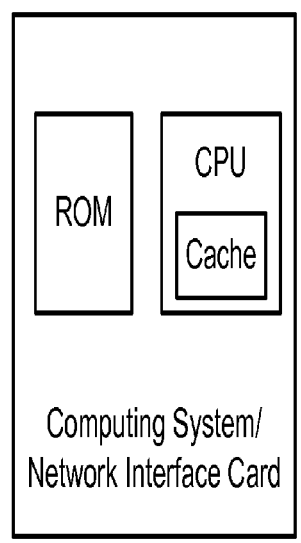
FIG. 6 illustrates a system having one or more memory arrays configured in accordance with an embodiment of the present invention.

FIG. 6 illustrates a system having one or more memory arrays configured in accordance with an embodiment of the present invention. The system can be, for example, a computing system (e.g., laptop or desktop computer, server, or smart phone) or a network interface card or any other system that employs memory. As will be appreciated, memory technology effectively has an almost unlimited number of applications at the system level, and the specific system shown is merely provided as an example.

As can be seen, the system generally includes a ROM and central processing unit (CPU, or processor) configured with on-chip cache. Any suitable processor can be used, such as those provided by Intel Corporation (e.g., Intel® Core™, Pentium®, Celeron®, and Atom™ processor families). The processor can access its on-chip cache and/or the ROM and execute functionality particular to a given application, as commonly done. Each of the ROM and/or on-chip cache can be implemented as a memory array, as described herein. Other system componentry (such as display, keypad, random access memory, co-processors, bus structures, etc) are not shown, but will be apparent given the particular system application at hand.

Numerous embodiments and configurations will be apparent in light of this disclosure. For instance, one example embodiment of the present invention provides a memory device. The device includes a memory array having a plurality of memory cells, each for storing a bit of information. The device further includes a bitline precharging circuit for precharging a bitline associated with a column of the memory array. The device further includes a circuit for generating a precharge control signal that enables the bitline precharging circuit to precharge the bitline. The device further includes a bitline floating circuit having a single logic gate for qualifying the precharge control signal with a wake signal, so that precharging of the bitline does not occur if the wake signal is not in an active state. In one specific example case, the device may include at least one of a decoder for receiving an address associated with a read or write access of the memory array and generating a word line signal for selecting a corresponding row of the memory array, and a read/write column multiplexer for allowing multiple columns of the memory array to share a sense amplifier for readout of memory cells in those columns and/or a write driver for writing to memory cells in those columns. In another specific example case, the bitline floating circuit can be integrated into the circuit for generating a precharge control signal. In another specific example case, the device is a static random access memory (SRAM). In another specific example case, the single logic gate for qualifying the precharge control signal with a wake signal is an OR-gate (other single gates will be apparent in light of this disclosure, such as an AND-gate). In another specific example case, the device may include sleep/shut-off circuitry for disconnecting nominal power from input/output circuitry of the device when the memory array is not being accessed or is permanently disabled for yield recovery, the input/output circuitry including at least one of a read/write column multiplexer, a sense amplifier, a write driver, and the bitline precharging circuit. In one example such case, the sleep/shut-off circuitry has a PMOS transistor that switches in the nominal power to the input/output circuitry in response to the wake signal being in an active state, and disconnects the nominal power to the input/output circuitry in response to the wake signal not being in an active state. In another such example case, the sleep/shut-off circuitry further includes bias circuitry for providing a virtual power level to the input/output circuitry, the virtual power level being lower than the nominal power. The virtual power level can be, for example, the nominal power less 1 to 2 threshold voltages of an NMOS transistor. In another such example case, the bias circuitry is disabled for yield recovery.

Another example embodiment of the present disclosure provides a memory device. In this example configuration, the device includes a memory array having a plurality of SRAM memory cells, each for storing a bit of information. The device further includes a bitline precharging circuit for precharging a bitline associated with a column of the memory array. The device further includes a circuit for generating a precharge control signal that enables the bitline precharging circuit to precharge the bitline. The device further includes a bitline floating circuit having a single logic gate for qualifying the precharge control signal with a wake signal, so that precharging of the bitline does not occur if the wake signal is not in an active state. The device further includes input/output circuitry including at least one of a read/write column multiplexer, a sense amplifier, a write driver, and the bitline precharging circuit. The device further includes sleep/shut-off circuitry having a PMOS transistor that switches in nominal power to the input/output circuitry in response to the wake signal being in an active state, and disconnects the nominal power to the input/output circuitry in response to the wake signal not being in an active state. In one specific such example case, the device may include, for instance, a decoder for receiving an address associated with a read or write access of the memory array and generating a word line signal for selecting a corresponding row of the memory array, and/or a read/write column multiplexer for allowing multiple columns of the memory array to share a sense amplifier for readout of memory cells in those columns and/or a write driver for writing to memory cells in those columns. In another specific example case, the bitline floating circuit is integrated into the circuit for generating a precharge control signal. In another specific example case, the single logic gate for qualifying the precharge control signal with a wake signal is an OR-gate. In another specific example case, the sleep/shut-off circuitry may further include bias circuitry for providing a virtual power level to the input/output circuitry in response to the wake signal not being in an active state, wherein the virtual power level is the nominal power less 1 to 2 threshold voltages of an NMOS transistor.

Another example embodiment of the present disclosure provides a method for conserving power in a memory device configured with a memory array having a plurality of memory cells. The method includes generating a precharge control signal that enables a bitline precharging circuit to precharge a bitline associated with a column of the memory array, and qualifying (with a single logic gate) the precharge control signal with a wake signal, so that precharging of the bitline does not occur if the wake signal is not in an active state. The method may further include, for example, receiving an address associated with a read or write access of the memory array and generating a word line signal for selecting a corresponding row of the memory array, and/or allowing multiple columns of the memory array to share a sense amplifier for readout of memory cells in those columns and/or a write driver for writing to memory cells in those columns. In one particular case, the single logic gate for qualifying the precharge control signal with a wake signal is an OR-gate. In another particular case, the method includes disconnecting nominal power from input/output circuitry of the device when the memory array is not being accessed or is permanently disabled for yield recovery, the input/output circuitry including at least one of a read/write column multiplexer, a sense amplifier, a write driver, and the bitline precharging circuit. In one such case, the disconnecting is carried out by a PMOS transistor that switches in the nominal power to the input/output circuitry in response to the wake signal being in an active state, and disconnects the nominal power to the input/output circuitry in response to the wake signal not being in an active state. In another such case, the method includes providing, with bias circuitry, a virtual power level to the input/output circuitry, the virtual power level being lower than the nominal power. The virtual power level can be, for example, the nominal power less 1 to 2 threshold voltages of an NMOS transistor. In another such case, the method further includes disabling the bias circuitry for yield recovery.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A memory device, comprising:
   a memory array having a plurality of memory cells, each for storing a bit of information;
   a bitline precharging circuit for precharging a bitline associated with a column of the memory array;
   a bitline floating circuit having a logic gate for qualifying a precharge control signal with a wake signal, so that precharging of the bitline does not occur if the wake signal is not in an active state;
   sleep/shut-off circuitry including a first transistor for disconnecting nominal power provided by a nominal power supply from input/output circuitry of the device when the memory array is not being accessed or is permanently disabled for yield recovery, the sleep/shut-off circuitry including a node coupled to the input/output circuitry including at least one of a read/write column multiplexer, a sense amplifier, a write driver, and the bitline precharging circuit; and
   wherein the sleep/shut-off circuitry further comprises bias circuitry coupled to the node and the nominal power supply, the bias circuitry including a second transistor for providing a virtual power level to the input/output circuitry by limiting the nominal power supply voltage, the virtual power level being lower than the nominal power, wherein the second transistor to receive a shut off signal to turn off the second transistor for at least a portion of the memory array that is permanently disabled for yield recovery, wherein the second transistor prevents generation of the virtual power level when the second transistor is off, wherein the second transistor is the only transistor of the bias circuitry.

2. The memory device of claim 1 further comprising at least one of:
   a decoder for receiving an address associated with a read or write access of the memory array, and generating a word line signal for selecting a corresponding row of the memory array; and
   a read/write column multiplexer for allowing multiple columns of the memory array to share a sense amplifier for readout of memory cells in those columns and/or a write driver for writing to memory cells in those columns.

3. The memory device of claim 1 wherein the bitline floating circuit is integrated into the circuit for generating the precharge control signal.

4. The memory device of claim 1 wherein the device is a static random access memory (SRAM).

5. The memory device of claim 1 wherein the logic gate for qualifying the precharge control signal with the wake signal is an OR-gate.

6. The memory device of claim 1 wherein the first transistor comprises a PMOS transistor that switches in the nominal power to the input/output circuitry in response to the wake signal being in the active state, and disconnects the nominal power to the input/output circuitry in response to the wake signal not being in the active state.

7. The memory device of claim 1 wherein the bias circuitry further includes a third transistor connected serially with the second transistor between the nominal power supply and the node.

8. The memory device of claim 1 wherein the bias circuitry is disabled for yield recovery, wherein the shut off signal is set to turn off the second transistor for functional sub-arrays of the memory array.

9. A memory device, comprising:
   a memory array having a plurality of SRAM memory cells, each for storing information;
   a bitline precharging circuit for precharging a bitline associated with a column of the memory array;
   a floating circuit having a logic gate for qualifying a precharge control signal with a wake signal, so that precharging of the bitline does not occur if the wake signal is not in an active state;
   input/output circuitry including at least one of a read/write column multiplexer, a sense amplifier, a write driver, and the bitline precharging circuit;
   sleep/shut-off circuitry including a node coupled to the input/output circuitry, the sleep-shut-off circuitry having a PMOS transistor that switches in nominal power provided by a nominal power supply to the input/output circuitry in response to the wake signal being in the active state, and disconnects the nominal power to the input/output circuitry in response to the wake signal not being in the active state;
   wherein the sleep/shut-off circuitry further comprises bias circuitry coupled to the node and the nominal power supply, the bias circuitry including a NMOS transistor for providing a virtual power level to the input/output circuitry by limiting the nominal power supply voltage in response to the wake signal not being in the active state, the virtual power level being lower than the nominal power, wherein the NMOS transistor to receive a shut off signal to turn off the NMOS transistor for at least a portion of the memory array that is permanently disabled for yield recovery, wherein the NMOS transistor prevents generation of the virtual power level when the NMOS transistor is off.

10. The memory device of claim 9 further comprising:
a decoder for receiving an address associated with a read or write access of the memory array, and generating a word line signal for selecting a corresponding row of the memory array; and
wherein the node is coupled to the read/write column multiplexer for allowing multiple columns of the memory array to share a sense amplifier for readout of memory cells in those columns and/or the write driver for writing to memory cells in those columns.

11. The memory device of claim 9 wherein the floating circuit is integrated into the circuit for generating the precharge control signal.

12. The memory device of claim 9 wherein the logic gate for qualifying the precharge control signal with the wake signal is an OR-gate.

13. The memory device of claim 9 wherein the bias circuitry further comprises another transistor connected serially with the NMOS transistor between the nominal power supply and the node.

14. A method for conserving power in a memory device configured with a memory array having a plurality of memory cells, the method comprising:
generating a precharge control signal that enables a bitline precharging circuit to precharge a bitline associated with a column of the memory array; and
qualifying, with a logic gate, the precharge control signal with a wake signal, so that precharging of the bitline does not occur if the wake signal is not in an active state;
disconnecting, with sleep/shut-off circuitry including a node coupled to an input/output circuitry, nominal power provided by a nominal power supply from input/output circuitry of the device when the memory array is not being accessed or is permanently disabled for yield recovery, the input/output circuitry including at least one of a read/write column multiplexer, a sense amplifier, a write driver, and the bitline precharging circuit;
providing, with bias circuitry coupled to the node and the nominal power supply, a virtual power level to the input/output circuitry by limiting the nominal power supply voltage, the virtual power level being lower than the nominal power; and
disabling the bias circuitry in response to receiving a shut off signal for at least a portion of the memory array that is permanently disabled for yield recovery, wherein the bias circuitry includes a first transistor that prevents generation of the virtual power level when the first transistor is off, wherein the first transistor is the only transistor of the bias circuitry.

15. The method of claim 14 further comprising at least one of:
receiving an address associated with a read or write access of the memory array, and generating a word line signal for selecting a corresponding row of the memory array; and
allowing multiple columns of the memory array to share a sense amplifier for readout of memory cells in those columns and/or a write driver for writing to memory cells in those columns.

16. The method of claim 14 wherein the logic gate for qualifying the precharge control signal with the wake signal is an OR-gate.

17. The method of claim 14 wherein the disconnecting is carried out by a PMOS transistor that switches in the nominal power to the input/output circuitry in response to the wake signal being in the active state, and disconnects the nominal power to the input/output circuitry in response to the wake signal not being in the active state.

18. The method of claim 14 wherein the bias circuitry further includes a second transistor between the first transistor and the node, the second transistor connected serially with the first transistor.

19. The memory device of claim 1 wherein the first transistor is a PMOS transistor and the second transistor is an NMOS transistor.

20. The method of claim 14 wherein the first transistor is an NMOS transistor, wherein the sleep-shut-off circuitry includes a second transistor, which is a PMOS transistor for disconnecting nominal power provided by a nominal power supply from input/output circuitry of the device when the memory array is not being accessed or is permanently disabled for yield recovery.

* * * * *